United States Patent [19]

Tanabe

[11] Patent Number: 5,418,392
[45] Date of Patent: May 23, 1995

[54] LDD TYPE MOS TRANSISTOR

[75] Inventor: Akira Tanabe, Tokyo, Japan

[73] Assignee: NEC Corporation, Tokyo, Japan

[21] Appl. No.: 255,721

[22] Filed: Jun. 7, 1994

[30] Foreign Application Priority Data

Jun. 7, 1993 [JP] Japan .................. 5-135511

[51] Int. Cl.$^6$ ............................ H01L 29/78
[52] U.S. Cl. .................. 257/336; 257/344;
  257/388; 257/408; 257/402; 257/412
[58] Field of Search ............ 257/336, 344, 388, 402,
  257/408, 412

[56] References Cited

U.S. PATENT DOCUMENTS 5,256,586 10/1993 Choi et al. .................. 257/336

OTHER PUBLICATIONS

A New Degradation Mechanism of Current Drivability And Reliability Of Asymmetrical LLDMOSFET's T. Mizuno, Y. Matsumoto, S. Sawada, S. Shinozaki, And O. Ozawa "IDEM Technical Digest", Jan. 1985—pp. 250 To 253.

Tomohisa Mizuno, et al., *High Dielectric LDD Spacer Technology for High Performance MOSFET Using Gate–Fringing Field Effects.* IEDM (1989) pp. 613–615.

A. Shimizu, et al., *High Drivability and High Reliability MOSFETs with Non-Doped Poly-Si Spacer LDD Structure (SLDD).* Symposium on VLSI Technology Digest of Technical Papers (1992) pp. 90–91.

Tiao-yuan Huang, et al., *A Novel Submicron LDD Transistor With Inverse-T Gate Structure.* IEDM (1986) pp. 742–745.

*Primary Examiner*—Edward Wojciechowicz
*Attorney, Agent, or Firm*—Popham, Haik, Schnobrich & Kaufman, Ltd.

[57] ABSTRACT

A gate electrode comprises a N+ type polysilicon film and N− type polysilicon films directly contacted with side of the N+ type polysilicon film. Under the N+ type polysilicon films, N− type source.drain regions are provided in a P type silicon substrate to be coplanar with the main surface thereof.

4 Claims, 6 Drawing Sheets

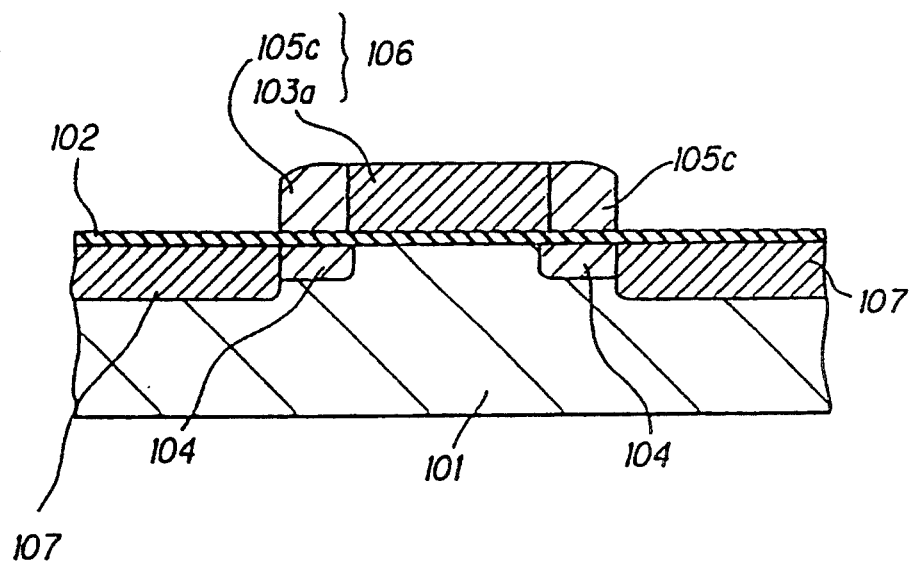
FIG. 5
FIG. 6
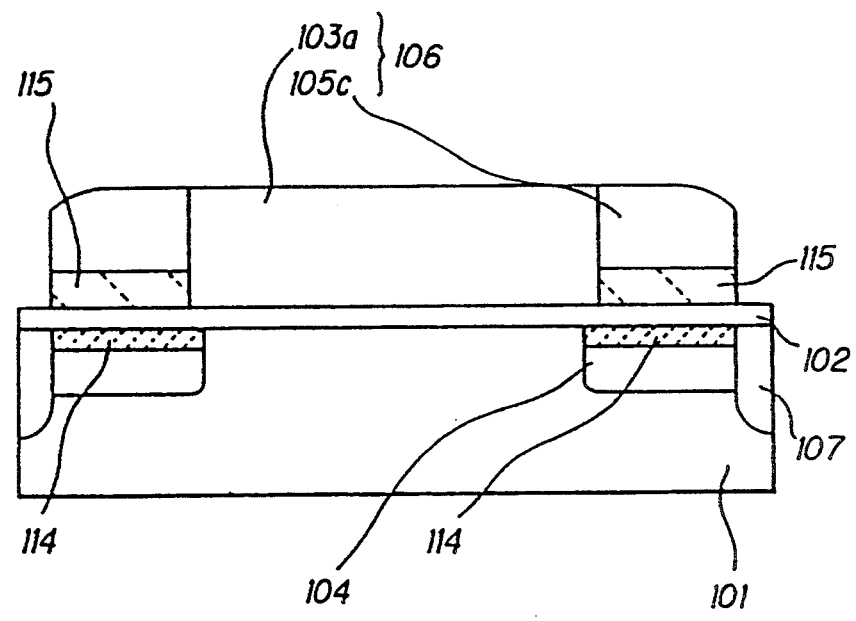

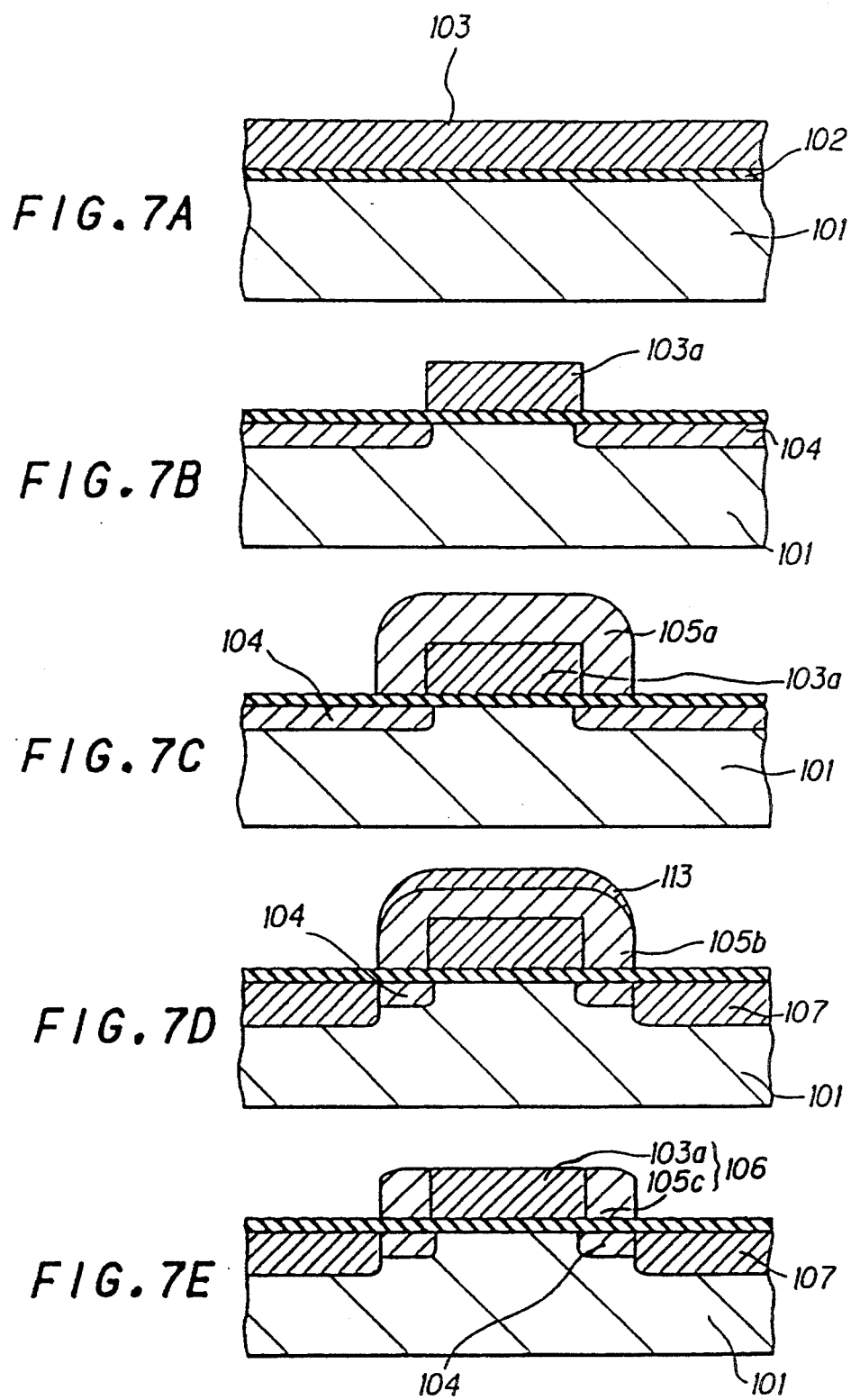

LDD TYPE MOS TRANSISTOR

FIELD OF THE INVENTION

The invention relates to a lightly doped drain (LDD) type MOS transistor, and more particularly, to a LDD type MOS transistor having a decreased electric resistance of a drain region without deteriorating other characteristics.

BACKGROUND OF THE INVENTION

First to third conventional LDD type MOS transistors have been proposed. The first conventional LDD type MOS transistor includes a gate electrode for covering areas on a silicon oxide film, under which N$^-$ type source.drain regions are formed on a P type silicon substrate by a predetermined depth. The second conventional LDD type MOS transistor includes silicon nitride film spacers provided on sides of a gate electrode, wherein the film spacers cover areas on a silicon oxide film formed on a P type silicon substrate, under which N$^-$ type source.drain regions are formed on the P type silicon substrate by a predetermined depth. The third conventional LDD type MOS transistor includes a silicon oxide film for covering a gate electrode and non-doped polysilicon film spacers provided on sides of the silicon oxide film-covered gate electrode, wherein the film spacers cover areas on a P type silicon substrate, under which N$^-$ type source.drain regions are formed on the P type silicon substrate by a predetermined depth.

In the first to third conventional LDD type MOS transistors, an accumulation layer is easy to be formed on the N$^-$ type drain region, so that an electric resistance of the N$^-$ type drain region is decreased. The detail of the first to third conventional LDD type MOS transistors will be explained prior to the explanations of preferred embodiments according to the invention.

In the first conventional LDD type MOS transistor, however, there is a disadvantage in that a capacitance is increased between the gate electrode and each of the N$^-$ type source.drain regions.

In the second conventional LDD type MOS transistor, there is a disadvantage in that the silicon nitride film spacers have a number of trap levels to lower the reliability.

In addition, the third conventional LDD type MOS transistor has a disadvantage in that operation is unstable, because a potential of the non-doped polysilicon film spacers is under a floating state due to the structure in which the nondoped polysilicon film spacers are not connected to any electrode or any interconnection.

SUMMARY OF THE INVENTION

Accordingly, it is an object of the invention to provide a LDD type MOS transistor having a decreased capacitance between a gate electrode and each of lightly doped source.drain regions.

It is a further object of the invention to provide a LDD type MOS transistor having high reliability.

It is a still further object of the invention to provide a LDD type MOS transistor operating stably with a decreased electric resistance of a lightly doped drain.

According to the invention, a LDD type MOS transistor, comprises:

a silicon substrate of a first conductivity type being selectively covered with a gate insulating film on a main surface thereof;

a gate electrode comprising a first polysilicon film and second polysilicon films connected electrically to sides of the first polysilicon film, the first and second polysilicon films being formed on the silicon substrate by interposing the gate insulating film therebetween, the first polysilicon film having a first predetermined width and a high concentration of a second conductivity type opposite to the first conductivity type, and the second polysilicon films having a second predetermined width and a low concentration of the second conductivity type at least at first portions in vicinity of bottom surfaces adjacent to the gate insulating film;

a pair of first diffusion regions having a low concentration of the second conductivity type, the first diffusion regions being provided in the silicon substrate to be coplanar with the main surface, and having an interval equal to the first predetermined width, and edges of the first diffusion regions being aligned with edges of the first polysilicon film; and a pair of second diffusion regions having a high concentration of the second conductivity type, the second diffusion regions being provided in the silicon substrate to be coplanar with the main surface, and edges of the second diffusion regions being aligned with edges of the second polysilicon films, a first one of the first diffusion regions being electrically connected to a first one of the second diffusion regions, and a second one of the first diffusion regions being electrically connected to a second one of the second diffusion regions, thereby providing a pair source.drain regions.

BRIEF DESCRIPTION OF THE DRAWINGS

The invention will be explained in more detail in conjunction with appended drawings, wherein:

FIG. 5 is a cross-sectional view showing a LDD type MOS transistor in a first preferred embodiment according to the invention, FIG. 6 is a schematic view explaining operation in the first preferred embodiment, FIGS. 7A to 7E are cross-sectional views showing a process for fabricating the LDD type MOS transistor in the fist preferred embodiment.

DESCRIPTION OF THE PREFERRED EMBODIMENTS

Before explaining a MOS transistor and a method for fabricating the same in the preferred embodiments according to the invention, the aforementioned conventional MOS transistor will be explained.

Figure 1:
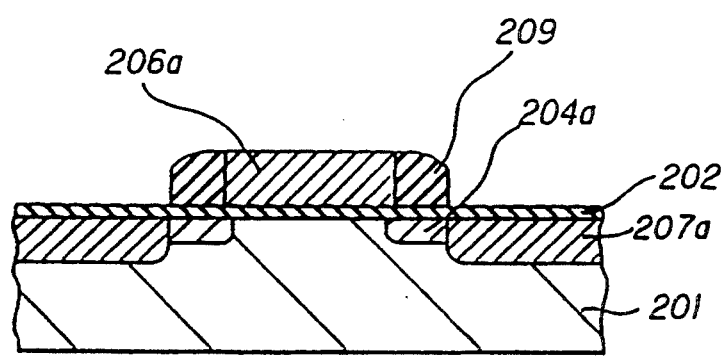
FIG. 1 is a cross-sectional view showing a conventional LDD type MOS transistor.

FIG. 1 shows the conventional LDD type MOS transistor which comprises a P type silicon substrate 201, a gate oxide film 202 covering the surface of the P type silicon substrate 201, a gate electrode 206a provided on the P type substrate 201 by interposing the oxide film 202 therebetween, a pair of N− type source.-drain regions 204a, a pair of N+ type source.drain regions 207a, and oxide silicon film spacers 209 of a predetermined width on side of the gate electrode 206a. In this MOS transistor, the N− type source.drain regions 204a and the N+ type source.drain regions 207a are provided to be self-aligned with the gate electrode 206a and the oxide silicon film spacers 209 on the surface of the P type silicon substrate 201 by predetermined depths, and the gate electrode 206a is uniform in th concentration of impurities, and is not formed to completely cover an LDD region (the N− type source.drain regions 204a).

In accordance with the structure of the MOS transistor, an electric field is weakened in the vicinity of the increase the reliability for hot carriers.

In the MOS transistor, however, there is a disadvantage in that a drain current is decreased, because the impurity concentration of the N− type source.drain regions 204a is low to increase an electric resistance.

In order to overcome the disadvantage, various MOS transistors have been proposed.

Figure 2:
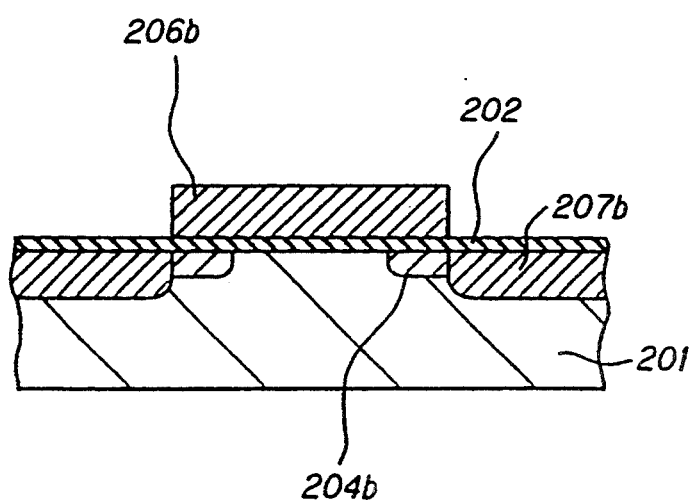
FIGS. 2 to 4 are cross-sectional views showing first to third conventionally proposed LDD type MOS transistors having decreased electric resistances of lightly doped drains to overcome a disadvantage of the conventional LDD type MOS transistor in FIG. 1.

FIG. 2 shows one of the proposed MOS transistors, wherein like part are indicated by like reference numerals as used in FIG. 1, while a gate electrode 208b is provided to cover a N− type source.drain regions 204b. In this MOS transistor, an accumulation layer is easy to be formed on the surface of the N− type source.drain regions 204b to decrease an electric resistance of the N− type source.drain regions 204b. This MOS transistor has been explained on pages 250 to 253 of "IEDM Technical Digest, 1985". In this MOS transistor, a N+ type source.drain regions 207b is provided to be self-aligned with the gate electrode 206b on the P type silicon substrate 201 by a predetermined depth.

Figure 3:
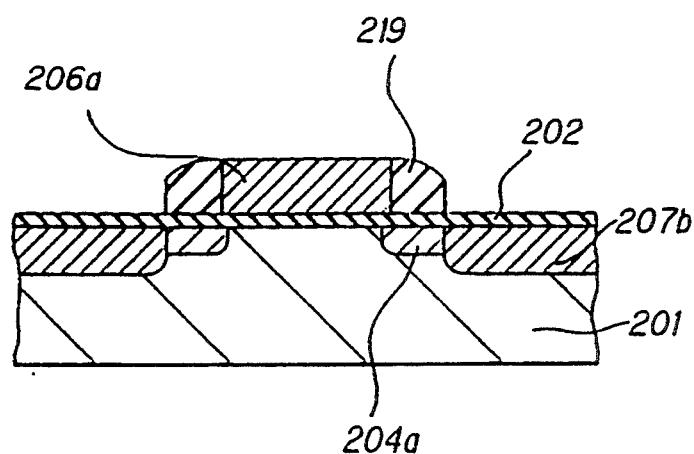

FIG. 3 shows the second one of the proposed MOS transistors, wherein like parts are indicated by reference numerals as used in FIGS. 1 and 2, while silicon nitride film spacers 219 are provided on sides of the gate electrode 206a.

In this MOS transistor, the silicon nitride film spacers 219 are of a dielectric constant greater than that of the silicon oxide film spacer 209, so that an accumulation layer are easy to be formed on the N− type source.drain regions 204a. Consequently, an electric resistance of N− type source.drain regions 204a is decreased. This MOS transistor has been explained on pages 613 to 616 of "IEDM Technical Digest, 1989."

Figure 4:
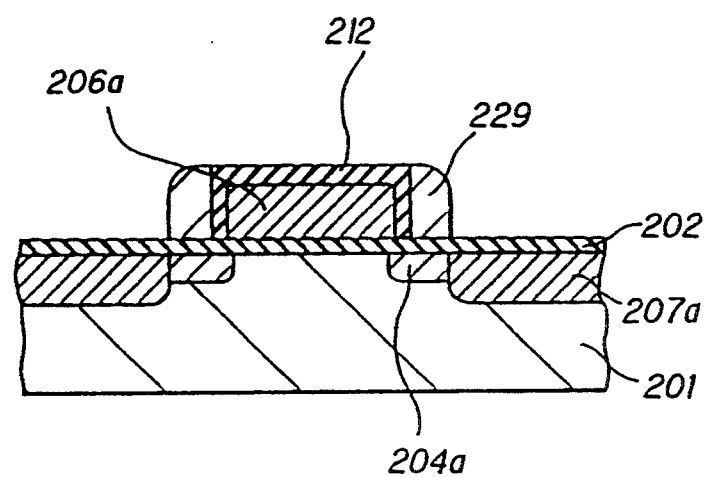

FIG. 4 shows the third one of the proposed MOS transistors, wherein like parts are indicated by like reference numerals as used in FIGS. 1 to 3, while the gate electrode 206a is covered with a silicon oxide film 212, and non-doped polysilicon film spacers 229 are provided on sides of the silicon oxide-covered gate electrode 206a. In this MOS transistor, a dielectric constant of the non-doped polysilicon film spacers 229 is regarded to be increased for the structural reason, so that accumulation layers are easy to be formed on the N− type source.drain regions 204a. Consequently, an electric resistance of the N− type source.drain regions 204a is decreased.

Next, a LDD type MOS transistor in the first preferred embodiment according to the invention will be explained in FIG. 5.

The LDD type MOS transistor is a N channel MOS transistor which comprises a P type silicon substrate 101, a gate oxide film 102, a gate electrode 106 provided on the gate oxide film 102 covering the surface of the P type silicon substrate 101, a pair of N− type source.-drain regions 104 provided on the P type silicon substrate 101 by a predetermined depth, and a pair of N+ type source.drain regions 107. The gate electrode 106 comprises N+ type polysilicon film 103a having a first predetermined width (gate length) and a N− type polysilicon film 105c having a second predetermined width connected to the side walls of the N+ polysilicon film 103a, wherein an impurity concentration of the N+ polysilicon film 103a is approximately $1 \times 10^{20} \text{cm}^{-3}$, and that of the N− type polysilicon film 105c is approximately $1 \times 10^{18} \text{cm}^{-3}$, and the N− type source.drain regions 104 and the N+ type source.drain regions 107 are provided to be self-aligned with the N+ type polysilicon film 103a and the N+type polysilicon film 105c, respectively.

In operation, when a positive voltage is applied to the gate electrode 106, accumulation layers 114 are formed in the N− type source.drain regions 114 in the vicinity of interfaces between the gate oxide film 102 and a respective one of the N− type source.drain regions 114, as shown in FIG. 6. Further, depletion layers 115 are formed in the N− type polysilicon film 105c in the vicinity of interfaces between the gate oxide film 102 and a respective one of the N− type polysilicon films 105c.

In accordance with the formation of the accumulation layers 114, an electric resistance of the N− type source.drain regions 104 including the accumulation layers 114, that is, lightly doped drain regions is made low to increase a drain current. At the same time, the increase of parasitic capacitances between the gate electrode and the drain regions are suppressed in accordance with the formation of the depletion layers 115. As a matter of course, the N− type polysilicon films 105c are electrically connected to the N+ type polysilicon film 103a, so that unstable operation is avoided.

The above described LDD type MOS transistor in the first preferred embodiment will be fabricated by the steps as shown in FIGS. 7A to 7E.

In FIG. 7A, a gate oxide film 102 and a N+ type polysilicon film 103 are successively and selectively formed on a P type silicon substrate 101. The N+ type polysilicon film 103 is obtained by depositing a non-doped polysilicon film and diffusing or ion-injecting N impurities into the non-doped polysilicon film, or by growing a non-doped polysilicon film simultaneously with the doping of N impurities.

In FIG. 7B, the N+ type polysilicon film 103 is patterned to be a N+ type polysilicon film 103a having a first predetermined width. Then, N− type source.drain regions 104 are formed on the P type silicon substrate 101 to be self-aligned with the N+ type polysilicon film 103a by ion-injection using the N+ type polysilicon film 103a as a mask.

In FIG. 7C, a N− type polysilicon film 105a having a thickness equal to be a second predetermined width is formed on top and side surfaces of the N+ type polysilicon film 103a. The growth of the N− type polysilicon film 105a is carried out in the same condition as in the selective epitaxial growth of a mono-crystalline silicon film on an exposed surface of a silicon substrate. For instance, the condition in which a source gas in dichrolsilane, a reducing agent is $H_2$ gas, a growth temperature is approximately 800° C., and degree of vacuum is approximately 100 Torr is adopted. In this selective growth, if phosphine is added to provide the N− type polysilicon film 105a, the concentration distribution of N impurities is uniform therein.

In FIG. 7D, the N+ type polysilicon film 105a is used as a mask to provide N+ type source.drain regions 107 on the P type silicon substrate 101 in accordance with ion-injection. At the same time, an upper portion of the N− type polysilicon film 105a is changed to be a N+ type polysilicon film 113, and a remaining portion thereof is indicated by the reference numeral 105b. As a result, the N+ type source.drain regions 107 are self-aligned with the N+ type polysilicon film 105a. In this ion-injection step, an ion-injection energy is required to be set at a predetermined level, so that the N+ type polysilicon film 113 does not reach the interfaces between the N− type polysilicon film 105a and the gate oxide film 102.

In FIG. 7E, the etching-back of polysilicon films is carried out to expose the N+ type polysilicon film 103a. Consequently, a gate electrode 106 comprising the N+ type polysilicon film 103a and the N− type polysilicon film 105c connected electrically thereto is obtained.

Next, the fabrication of a LDD type MOS transistor in the second preferred embodiment according to the invention will be explained in FIGS. 8A to 8C.

Figure 8A:
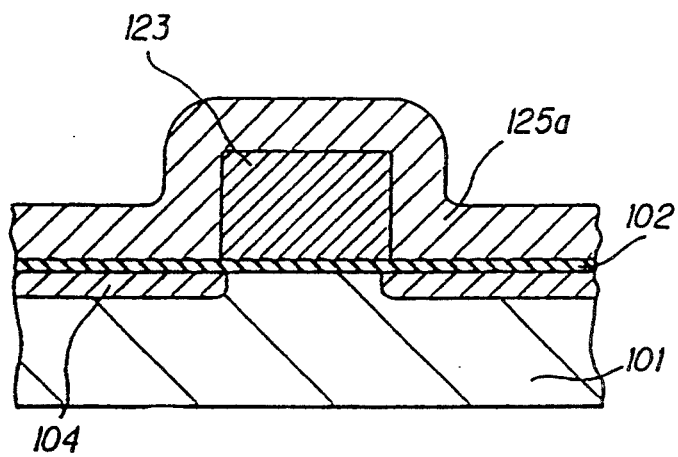
FIGS. 8A to 8C are cross-sectional views showing a process for fabricating a LDD type MOS transistor in a second preferred embodiment according to the invention.

In FIG. 8A, a gate oxide film 102 and a N+ type polysilicon film 123 are successively and selectively grown on a P type silicon substrate 101, and the N+ type polysilicon film 123 is patterned to have a first predetermined width. The N− type source.drain regions 104 are provided on the P type silicon substrate 101 to be self-aligned with the N+ type polysilicon film 123 by ion-injection, and a N− type polysilicon film 125a having a thickness equal to a second predetermined width is formed on the whole surface of the above processed silicon substrate 101.

Figure 8B:
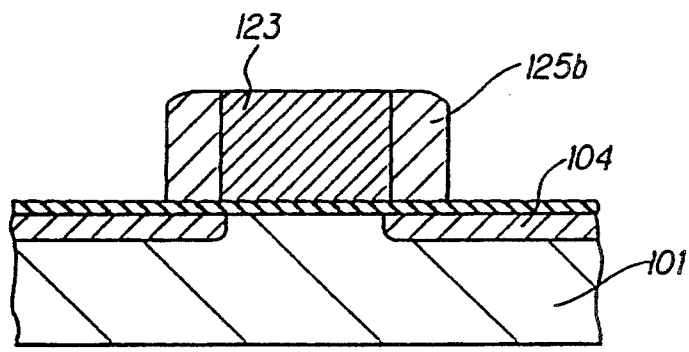

In FIG. 8B, the N− type polysilicon film 125a is etched back to expose the N+ type polysilicon film 123. Non-etched portions of the N− type polysilicon film 125a are indicated by the reference numerals 125b.

Figure 8C:
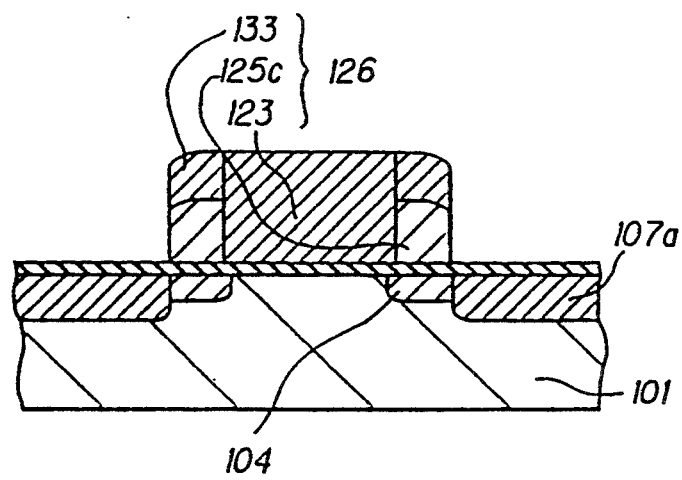

In FIG. 8C, the N− type polysilicon film 125b are used as a mask to provide N+ type source.drain regions 107a on the P type silicon substrate 101 in accordance with ion-injection. At the same time, upper portions of the N− type polysilicon films 125b are changed to be N+ type polysilicon films 133, and remaining portions thereof are indicated by the reference numeral 125c. As shown in FIG. 8C, a gate electrode 126 comprises the N+ type polysilicon film 123, the N− type polysilicon films 125c, and the N+ type polysilicon films 133 which are electrically connected to each other.

The LDD type MOS transistor in the second preferred embodiment has advantages in that an electric resistance of the gate electrode 126 becomes low, and a fabrication cost for the gate electrode 126 becomes low, respectively, as compared to those of the LDD type MOS transistor in the first preferred embodiment.

Referring back to FIG. 7D, if the N+ type polysilicon film 113 is formed to be in contact with the N+ type polysilicon film 103a, the etching-back step as shown in FIG. 7E is substantially unnecessary. In such a case, the LDD type MOS transistors in the first and second preferred embodiments are same in structure.

Figure 9:
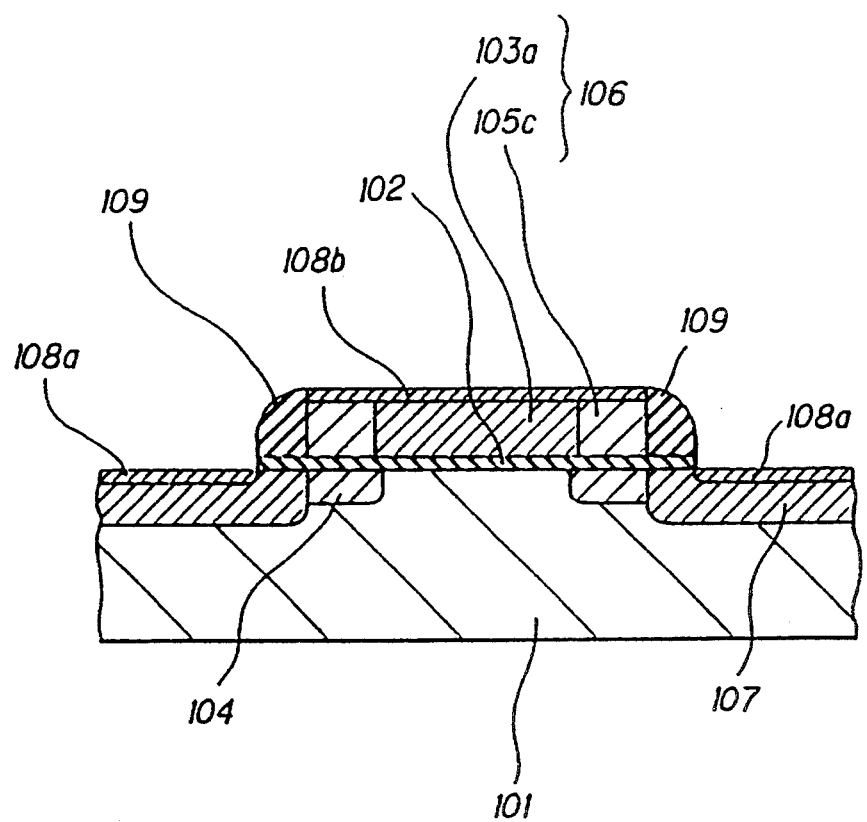
FIG. 9 is a LDD type MOS transistor in a third preferred embodiment according to the invention.

FIG. 9 shows a LDD type MOS transistor in the third preferred embodiment according to the invention, wherein like parts are indicated by like reference numerals as used in the first preferred embodiment. In this LDD type MOS transistor, silicide layers 108a of titanium are provided on the N+ type source.drain regions 107, and a silicide layer 108b of titanium is provided on the N+ type polysilicon film 103a and the N− type polysilicon films 105c for the gate electrode 106. Further, silicon oxide film spacers 109 are provided on sides of the gate electrode 106.

In the third preferred embodiment, electric resistances of the gate electrode 106 and the source.drain regions 104 and 107 becomes low as compared to those in the first preferred embodiment.

The LDD type MOS transistor in the third preferred embodiment will be fabricated as explained below.

The same steps as shown in FIGS. 7A to 7E are adopted in the same manner.

Thereafter, a silicon oxide film is provided on the whole surface of the processed P type silicon substrate 101, and the silicon oxide film is etched back to provide the silicon oxide films 109. Next, a titanium film is provided on the whole surface to be thermally treated, and the titanium film which is not reacted to be silicide is removed to provide the silicide layers 108a and 108b.

In the invention, electric charges induced in the lightly doped drain regions are increased to increase a drain current. On the other hand, depletion layers are formed in low concentration portions of a gate electrode to avoid the increase of parasitic capacitances. In addition, low and high concentration portions of the gate electrode are electrically connected to operate in stable manner.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is

1. A LDD type MOS transistor, comprising:
    a silicon substrate of a first conductivity type being selectively covered with a gate insulating film on a main surface thereof;
    a gate electrode comprising a first polysilicon film and second polysilicon films connected electrically to sides of said first polysilicon film, said first and second polysilicon films being formed on said silicon substrate by interposing said gate insulating film therebetween, said first polysilicon film having a first predetermined width and a high concentration of a second conductivity type opposite to said first conductivity type, and said second polysilicon films having a second predetermined width and a low concentration of said second conductivity type at least at first portions in vicinity of bottom surfaces adjacent to said gate insulating film;
    a pair of first diffusion regions having a low concentration of said second conductivity type, said first diffusion regions being provided in said silicon substrate to be coplanar with said main surface, and having an interval equal to said first predetermined width, and edges of said first diffusion regions being aligned with edges of said first polysilicon film; and a pair of second diffusion regions having a high concentration of said second conductivity type, said second diffusion regions being provided in said silicon substrate to be coplanar with said main surface, and edges of said second diffusion regions being aligned with edges of said second polysilicon films, a first one of said first diffusion regions being electrically connected to a first one of said second diffusion regions, and a second one of said first diffusion regions being electrically connected to a second one of said second diffusion regions, thereby providing a pair source.drain regions.

2. A LDD type MOS transistor, according to claim 1, wherein:
each of said second polysilicon films is a low concentration of said second conductivity type at a second portion excluding said first portion.

3. A LDD type MOS transistor, according to claim 1, wherein:
each of said second polysilicon films is a high concentration of said second conductivity type at a second portion excluding said first portion.

4. A LDD type MOS transistor, according to claim 1, further comprising:
a first silicide layer provided on said gate electrode to be electrically connected thereto;
insulating film spacers provided on sides of said second polysilicon films to be connected thereto; and
second silicide layers provided on said second diffusion regions to be electrically connected thereto, said second silicide layers being exposed to external space.

* * * * *